United States Patent
McLean et al.

(10) Patent No.: US 6,855,482 B2
(45) Date of Patent: Feb. 15, 2005

(54) LIQUID TRANSFER ARTICLES AND METHOD FOR PRODUCING THE SAME USING DIGITAL IMAGING PHOTOPOLYMERIZATION

(75) Inventors: Michael E. McLean, Etowah, NC (US); Brett Scherrman, Huntersville, NC (US); Douglas C. Neckers, Perrysburg, OH (US); Peter Serguievski, Perrysburg, OH (US)

(73) Assignee: Day International, Inc., Dayton, OH (US)

( * ) Notice: Subject to any disclaimer, the term of this patent is extended or adjusted under 35 U.S.C. 154(b) by 264 days.

(21) Appl. No.: 10/119,061

(22) Filed: Apr. 9, 2002

(65) Prior Publication Data

US 2003/0188652 A1 Oct. 9, 2003

(51) Int. Cl.[7] .............................. G03F 7/00; G03B 27/70
(52) U.S. Cl. ....................... 430/302; 430/296; 430/300; 355/67; 355/85; 347/238; 347/239; 347/255
(58) Field of Search ................................. 430/302, 300, 430/296; 355/47, 66, 43, 85, 67; 347/238, 239, 255

(56) References Cited

U.S. PATENT DOCUMENTS

| | | |
|---|---|---|
| 5,047,116 A | 9/1991 | Luthi et al. |
| 5,331,338 A | 7/1994 | Mager |
| 5,461,411 A | 10/1995 | Florence et al. |
| 5,622,811 A | 4/1997 | Ogue et al. |
| 5,877,848 A | 3/1999 | Gillette et al. |
| 6,018,402 A | 1/2000 | Campbell et al. |
| 6,200,646 B1 | 3/2001 | Neckers et al. |
| 6,309,797 B1 | 10/2001 | Grinevich et al. |

FOREIGN PATENT DOCUMENTS

| | | | |
|---|---|---|---|
| DE | 42 32 187 A1 | 3/1994 | |
| DE | 199 44 759 A1 | 3/2001 | |
| EP | 0 491 368 A2 | 6/1992 | |
| EP | 0 556 591 A1 | 8/1993 | |
| EP | 0845 710 A1 | 6/1998 | |
| EP | 0961174 A2 * | 12/1999 | ............ G03F/7/20 |
| WO | WO 98/53370 | 11/1998 | |

OTHER PUBLICATIONS

Doug Neckers, SC–10 Photopolymers and Photopolymerization, IS&T's 50th Annual Conference, pp. 1–60, IS&T—The Society for Imaging Science and Technology.

* cited by examiner

Primary Examiner—Thorl Chea
(74) Attorney, Agent, or Firm—Dinsmore & Schohl LLP

(57) ABSTRACT

A liquid transfer article is provided including a support assembly and an imaged surface formed directly on the surface of the support assembly by digital photopolymerization. The support assembly is in the form of a polymeric base, and the liquid transfer article is formed by providing a liquid photopolymer on the surface of the base and then irradiating the polymer with a light source to form the image. The liquid transfer article is reimagable and may be used in gravure printing processes, as well as other printing applications.

11 Claims, 3 Drawing Sheets

LIQUID TRANSFER ARTICLES AND METHOD FOR PRODUCING THE SAME USING DIGITAL IMAGING PHOTOPOLYMERIZATION

BACKGROUND OF THE INVENTION

The present invention relates to graphic arts reproduction, and more particularly to a liquid transfer article for use in transferring an accurately metered quantity of a liquid to another surface and a method for producing it by digital imaging photopolymerization.

One example of a liquid transfer article is a surface on a cylinder, belt, sleeve or plate that is used in printing processes to transfer a specified amount of a liquid coating material, such as ink or other substances, from the liquid transfer article to another surface or substrate. The volumetric capacity of the liquid transfer article is dependent upon the selection of size, shape, and number of cells per unit area. Cells comprise discrete areas on the surface of the liquid transfer article which hold the liquid. Varying these factors permits a high degree of precision in determining print densities. In addition, by controlling the location of the cells on the surface, a precise, predetermined image may be transferred to a receiving surface.

One example of such an article is a gravure surface which includes a pattern of cells or depressions adapted for receiving the liquid coating material. The area of the surface at a common level surrounding the pattern of cells is the land area surface. When the liquid coating material is applied to the article, the cells are filled with the liquid while the remaining land area surface of the article is removed by a wiper or doctor blade. Since the liquid coating material is contained only in the pattern defined by the cells, it is this pattern of liquid that is transferred to the other surface when contacted by the liquid transfer article.

Another example of a liquid transfer article is an anilox surface. The major difference between a gravure surface and an anilox surface is that the entire anilox surface is patterned whereas with a gravure surface only portions are patterned to form a predetermined image. The anilox surface is typically etched with an array of closely spaced, shallow cells or depressions. The liquid coating material flows into the cells as anilox surface contacts a reservoir. The anilox surface is then scraped with the doctor blade to remove excessive liquid coating material. The remaining liquid coating material in the cells transfers over to another surface when contacted.

In both types of liquid transfer articles, care needs to be taken to ensure that the land area surface is as smooth as possible. If the land area surface of the liquid transfer article is too coarse, removing the excessive liquid coating material from the land area surface of the coarse article becomes problematic resulting in the transfer of too much liquid onto the receiving surface and/or on the wrong location. Therefore, the land area surface of the liquid transfer article should be finished and the cells clearly defined so that they can accept a desired amount of the liquid coating material.

Prior art methods of producing liquid transfer articles having involved either etching a surface of a copper-plated printing element with chemicals or a high energy beam, such as a laser or an electron beam, or photopolymerization of a polymer onto a support base. In the former method, chemical etching is a time-consuming process that involves that use of multiple images in order to prepare a surface for etching. Laser etching, although faster than chemical etching, results in the formation of cells with a new recast surface about each cell and above the original surface or land surface area of the liquid transfer article. The recast surfaces have an appearance of a miniature volcano crater about each cell. This is caused by solidification of the molten material thrown from the surface when struck by the high-energy beam and their formation causes significant problems. As mentioned above, in order to transfer the liquid coating material in a controlled manner determined by the cell pattern, excess liquid has to be completely removed from the liquid transfer surface, for example by a doctor blade. Any excess liquid coating material remaining on the liquid transfer surface after running under the doctor blade will be deposited on the receiving product where it is not wanted and/or in undesired amount. With a laser-etched liquid transfer surface, the doctor blade cannot completely remove excess liquid from the image transfer surface due to the recast surfaces which retain some of the liquid. Thus, it is desirable in most printing applications to have a liquid transfer article which is void of recast surfaces.

Additionally, it has been noted that it is extremely difficult to control the depth and size of all the cells using laser-etching techniques which produce liquid transfer articles having printed patterns. Specifically, the laser is generally required to be activated only where cells are required and inactivated when no cells are required. Unfortunately, the laser start and stop response is not the same response that is achieved once the laser is operating for a set period. For example, when the laser is started, the first few pulses of radiation are less than the energy content of the laser beam for pulses produced after the laser has been operating for a suitable time. This in turn results in the shape and depth of the first few cells in the surface of the article being different from consecutive successive wells formed in the surface of the article.

Consequently, the cells defining the boundary of the pattern are not the same depth and/or size as the cells contained within the center of the pattern and therefore would be incapable of containing a desired volume of liquid. This results in the boundary of the pattern transferred to a receiving surface being off shaded with respect to the overall pattern. In other words, the edges of the printed pattern are somewhat fuzzy. This can result in different shades of the printed pattern being transferred to the receiving surface. Although laser-etching techniques provide an effective means for producing wells or depressions in the surface of liquid transfer articles, the non-uniformity of the few start and stop pulses of the laser can produce an inferior quality liquid transfer article. As such, typical finely engineered, copper-plated, engraved gravure print rollers are extremely expensive.

With the latter method of photopolymerization, typically a printing plate is formed by first placing a negative on a supporting glass plate. An optically transparent release film is then placed on top of the negative which is subsequently coated with a layer of photopolymerizable resin. A backing sheet is then placed on top of the photopolymerizable resin, and the backing sheet is then covered by another glass sheet. Irradiation by actinic light, such as UV light, through the top glass/backing sheet combination forms a solid floor layer of photoresin, which adheres to the backing sheet. The thickness of the floor layer is less than the total thickness of the photoresin. Irradiation through the lower glass plate negative release sheet selectively hardens the photoresin to form an image-printing surface which mirrors the image on the negative. The hardened regions adhere to the floor layer, but not to the transparent release sheet. Subsequent processing removes unhardened (liquid) photoresin to reveal a relief image.

When following the teachings of the prior art, the photopolymerizable resin layer can be placed on the glass plate and a capping blade can be drawn across the resin layer so as to level the layer of resin on the glass plate. The result is a relatively constant thickness resin layer formed on the supporting glass plate in the printing plate production assembly. The uniform layer of resin is then exposed to a UV light source through the negative so as to produce cross-linked solid areas in the resin layer which form a printing image or pattern in the resin layer. The non-cross-linked liquid portions of the resin layer are then removed from the plate, and the result is a selectively relieved cross-linked resin-printing pattern on the plate. The photo negatives required for this type of process can be both costly and time-consuming to produce.

U.S. Pat. No. 5,877,848 to Gillette, et al attempts to overcome the above-mentioned problems by disclosing a method of producing liquid transfer articles by extruding a predetermined thickness layer of a photopolymerizable resin, and then moving the extruded resin layer past a variable intensity light source. The intensity of the light source can be controlled by a preprogrammed microprocessor in several ways. One way of providing the variable intensity light source involves the use of a bank of lights which can be selectively turned "on" and "off", or can be selectively dimmed or brightened, by the use of microprocessor-controlled switches or rheostats. Selective cross-linking of the resin can be performed within the extrusion die, or the resin can be extruded onto a moving transparent support plate, and the variable intensity light source can be positioned above or below the support plate. In either case, the variable intensity light source may be controlled by a preprogrammed microprocessor, as described above.

Alternatively, the intensity of the light source may be controlled by the use of preprogrammed video signals in conjunction with a suitable video image-producing device. Although, the method disclosed by Gillette, et al is an improvement over previous methods, there still remains a need for faster printing plate production by photopolymerization, as the printing plate of Gillette is formed incrementally by serially cross-linking adjacent section of a layer of cross-linkable resin.

Accordingly, there remains a need in this art for a liquid transfer article which can be accurately imaged without a mask or laser, thereby lowering costs.

SUMMARY OF THE INVENTION

The present invention addresses the above-mentioned needs by providing a liquid transfer article for graphic arts reproduction having an imaged surface produced by digital imaging photopolymerization using a digital light processor. By image surface, it is meant the areas bounded by sidewalls of land areas provided in the liquid transfer article. The liquid transfer article may be utilized for example, in intaglio process such as direct and indirect gravure printing processes. Further, the liquid transfer article may also be useful in other graphic arts reproduction processes wherein anilox surfaces are utilized. While the present invention will be described with reference to the preferred embodiments relating to printing techniques, it should be understood that the liquid transfer article of the present invention may be used in any graphic arts reproduction process or system requiring the accurate metering of a liquid to one surface and the transfer of such liquid to another surface.

The imaged surface is formed by a digital light processing technique in which a flat polymeric base layer is provided. A quantity of liquid photopolymer is provided on at least a portion of the surface of the base layer, and irradiated with a light source reflected from a mirror-type spatial light modulator. The light source photopolymerizes selected portions of the liquid photopolymer such that after removal of the non-linked polymer, land surface areas of the imaged surface are formed on the surface of the base layer. The resulting liquid transfer article may then be mounted onto a printing device and used to print in a conventional manner. Once the particular printing job for which the image was produced has been completed, the liquid transfer article may be demounted and, if desired, the imaged surface may be removed so that the liquid transfer article surface can receive a new image. The imaged surface is preferably removed by an abrading mechanism, which mechanically grinds, scrapes, or cuts away the land surface areas thereof until the base layer is exposed.

Using a mirror-type spatial light modulator having a matrix of individually addressable micromirrors permits the simultaneous control of a desired image pattern definition in the x, y, and z dimensions. Additionally, the differentiation of the properties in the z dimension can also be controlled by selecting the gray-scale intensity or wavelength for each individual micromirror. Simultaneously controlling the wavelength or light intensity of each micromirror in the matrix permits the formation of the liquid transfer article having a cured photopolymer on the base layer which varies in properties such as depth, mechanical strength, hardness, and degree of cross-linking.

Because the liquid transfer article may be provided in the form of a replaceable sleeve or plate, the printer need not tie up a printing cylinder for each liquid transfer article, wherein the sleeves or plates may be readily demounted and stored. Further, as the image on the liquid transfer article is replaceable, the printer need not maintain a large inventory of sleeves or plates. This reduces costs. Lastly, as the land surface areas of the imaged surface are formed digitally, without the use of a mask or a laser, there is no degradation in quality of the printed image.

In accordance with one aspect of the invention, a liquid transfer article for use in graphic arts reproduction is provided comprising a polymer base layer and a photoresin layer having an imaged surface provided on the polymer base layer, wherein the photoresin layer has been formed directly onto the polymer base layer by digital imaging photopolymerization utilizing a mirror-type spatial light modulator. By photoresin, it is meant any photocurable or photopolymerizable resin material.

In accordance with another aspect of the invention, a method of making a liquid transfer article for use in graphic arts reproduction is provided comprising the steps of providing a base layer, and providing a liquid photopolymer on at least a portion of the surface of the base layer. The method further includes irradiating the liquid photopolymer with a desired image pattern from a digital light processor reflecting light from a light source for a time sufficient to photopolymerize the liquid photopolymer and form an imaged surface directly on the base layer.

In accordance with another aspect of the present invention, a digital imaging photopolymerization system for providing a cross-linked photopolymerized liquid transfer article for use in graphic arts reproduction is described. The system comprises a support assembly adapted to receive at least a first layer of a cross-linkable photopolymer, and a light source for irradiating the cross-linkable photopolymer layer. The system further includes a mirror-type spatial light modulator disposed between the light source and the support assembly, the modulator reflecting light from the light source in an image pattern toward the support assembly, and a microprocessor controlling at least the operation of the mirror-type spatial light modulator such that the image pattern is formed in the cross-linkable photopolymer layer.

In accordance with yet another aspect of the invention, a method of making a reimagable liquid transfer article for use in graphic arts reproduction is provided comprising the steps of providing a base layer, and providing an imaged surface on the surface of the base layer by digital imaging photopolymerization utilizing a mirror-type spatial light modulator to form a liquid transfer article. The method further includes mounting the liquid transfer article on a printing device and printing a substrate using the liquid transfer article, and demounting the liquid transfer article from the printing device and removing the imaged surface from the base layer such that the liquid transfer article is adapted to receive a new imaged surface thereon.

These, and other features and advantages of the present invention, will become apparent from the following detailed description, the accompanying drawings, and the appended claims.

BRIEF DESCRIPTION OF THE DRAWINGS

The following detailed description of the embodiments of the present invention can be best understood when read in conjunction with the following drawings, where like structure is indicated with like reference numerals and in which.

DETAILED DESCRIPTION OF THE PREFERRED EMBODIMENTS

While the liquid transfer article of the present invention will be described with reference to its preferred use as a liquid transfer article used in intaglio processes, such as direct and indirect gravure printing, it will be apparent to those persons skilled in the art that the plate may be modified for use in other graphic arts processes including direct and indirect flexographic printing processes. Moreover, the liquid transfer article may be used in any process or system requiring the accurate metering of a liquid to one surface and the transfer of such liquid to another surface.

Figure 1:
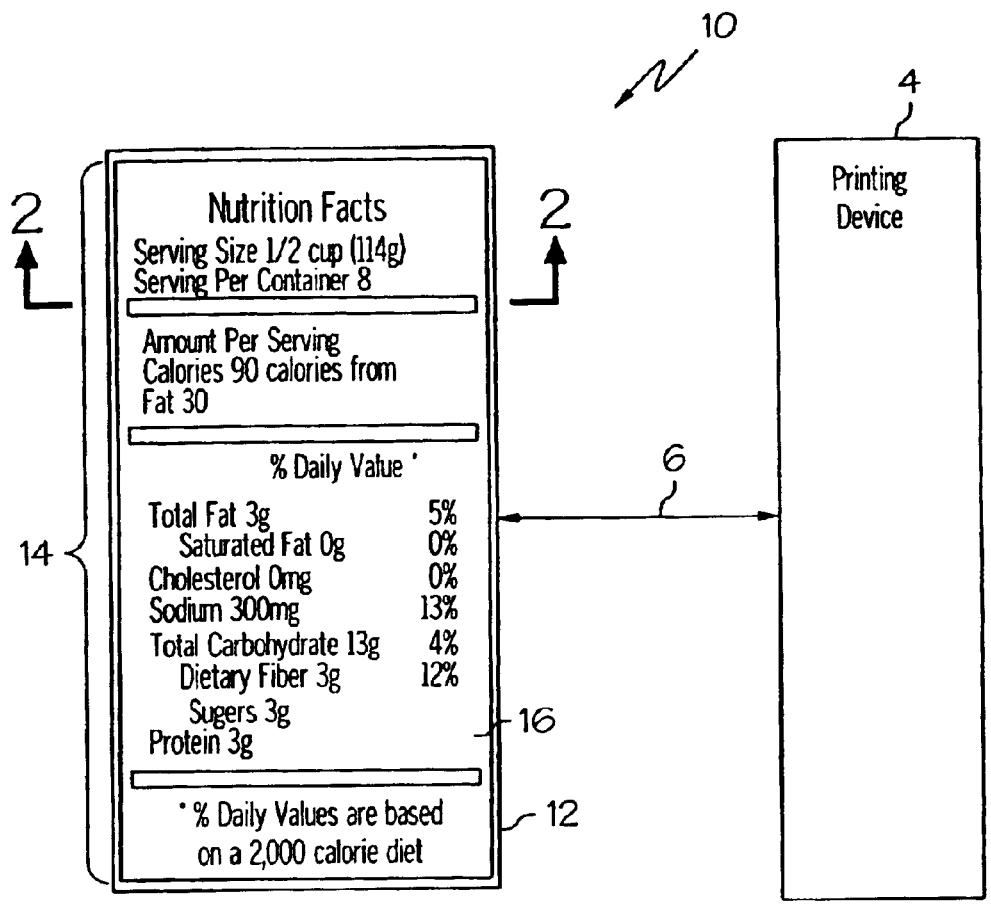
FIG. 1 is a front view of a first illustrative embodiment of a liquid transfer article with an imaged surface formed according to the methods of the present invention, which may be used with a printing device as a printing plate.
Figure 2:
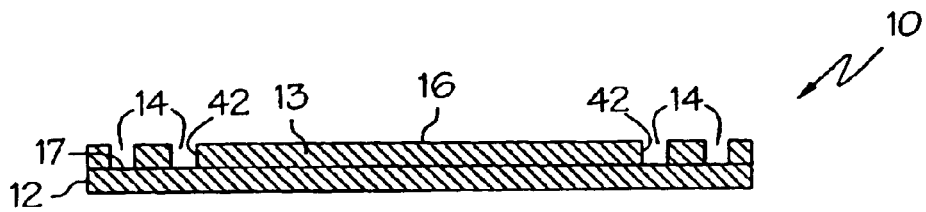
FIG. 2 is a sectional side view of the liquid transfer article of FIG. 1 taken along section line 2—2 of FIG. 1.

FIGS. 1 and 2 illustrate a first exemplary embodiment of a liquid transfer article 10 provided as flat plate comprised generally of a flat polymeric base layer 12 with an imaged surface 14 provided in a developed photoresin layer 13. By "image surface," it is meant the areas bounded by sidewalls of land areas 16 provided in the liquid transfer article, as best seen in FIG. 2. The base layer 12 can be any flexible material that is conventionally used in photosensitive elements. Examples of such materials include, but are not limited to, polymeric films, foams, and fabrics. Flexible metal or paper sheets, or laminates of any of these, can also be used as the base layer 12.

A preferred material for photoresin layer 13 is a polymer formed from a liquid resin that is provided as an initial undeveloped layer to the liquid transfer article 10. The liquid resin is a photocurable or photopolymerizable material that is sensitive to radiation commonly in the visible and ultraviolet regions of the electromagnetic spectrum (that is from about 300 to about 500 nm) and is developed as described herein. The terms "photocurable" and "photopolymerizable" are generally recognized as essentially the same in the art of gravure printing plates. Additionally, liquid photoresins or photopolymers are known in the art and commercially available from a number of companies, such as stereolithography acrylate (SL 5149) and hybrid epoxyacrylate (SL5170), both available from Ciba Speciality Chemicals, PHOTOMER 4770, available from Henkle, or SGL-1, available from Spectra Group Limited, Inc. Accordingly, any photopolymer formulation including at least one photopolymerizable monomer that can be polymerized upon exposure to the actinic radiation noted above may be used in the practice of this invention.

The formulation may also include one or more polymerization initiators that have sensitivity to the actinic radiation noted above, such as Irgacure 369 (Ciba), Irgacure 819 (Ciba), Darocure 1173 (Ciba), H-Nu 470 (Spectra Group Limited, Inc.). In most cases, the initiator will be sensitive to any visible or ultraviolet radiation. A more detailed discussion on other desirably compositions and the photochemical processes involved in using photopolymers, photocolorizable polymers or photoresponsive coatings with digital light processing technology is provided for in U.S. Pat. No. 6,200,646 to Neckers et al., which is herein fully incorporated by reference.

The thickness of the developed polymer base layer 12 can be varied, as long as it is sufficient to sustain the wear of a printing press, but thin enough to be flexible for wrapping around the printing form. A preferred polymer base material is a photoresin cured to a thickness of about 0.25 mm to about 0.4 mm. The polymer base layer 12 may be coated with one or more "subbing" layers to improve adhesion of the developed photoresin layer 13. The backside of the polymer base 12 may be coated with antistatic agents and/or slipping layers or matte layers to improve handling and "feel" of the article.

The imaged surface 14 may take the form of any indicia including numbers, letters, graphics, etc. needed to perform the print job. Generally, for gravure applications, the imaged surface 14 will be formed of discrete cells and each cell will have a well depth below the land surface areas 16 of the photoresin layer 13 from about 0.05 to about 1.00 mm, wherein a surface 17 (FIG. 2) of the support layer 12 forms the bottom of each well. It is to be appreciated that well depth of the imaged surface 14 may vary over the land surface areas 16 of the resin layer 13 depending on the desired amounts of a liquid coating material, such as ink, that are to be transferred from a specific region of the liquid transfer article 10 to another surface.

Figure 3:
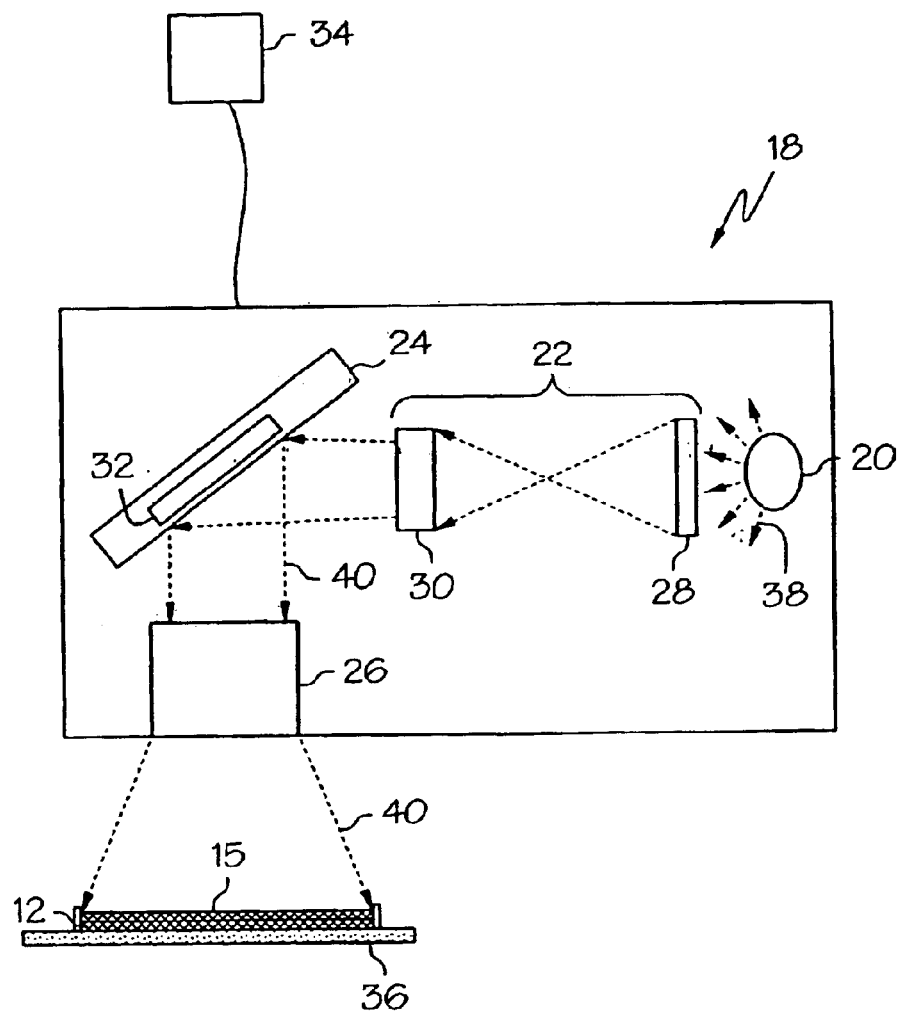
FIG. 3 is a schematic diagram of an image processing device used according to the methods of the present invention to produce a liquid transfer article which may be used in the preparation of a gravure printing plate.

With reference also to FIG. 3, the resin layer 13 is formed from the development of a liquid photoresin 15 which is provided on the polymeric base layer 12 using a digital light imaging system 18. The liquid photoresin layer 15 is a photocurable or photopolymerizable material that is sensitive to radiation commonly in the visible and ultraviolet regions of the electromagnetic spectrum (that is from about 300 to about 500 nm). Accordingly, the liquid photoresin layer 15 and the initial liquid resin provided to form the base layer 12 may be the same. A preferred formulation for the liquid photoresin layer 15 contains SL 5149 and 1.5% w of Irgacure 819. It has been found that with the imaging system 18, the preferred formulation produces land areas 16 having very fine details with no doming or rounding.

As shown in FIG. 3, the imaging system 18 includes a light source 20, a condenser 22, a digital light processor 24, and projection optics 26. The light source 20 provides actinic radiation to cure or polymerize the liquid photoresin layer 15 onto the polymer base layer 12. Preferably, the light source 20 is a light source, such as a metal halide lamp. The metal halide lamp should be unfiltered and have sufficient wattage, such as 270 W, to suitably cross-link the intended portions of liquid photoresin layer 15 with both visible and ultraviolet light. Lamps of higher light intensity will increase the rate of polymerization and may also be used.

The condenser 22 focuses the divergent spectral radiation of the light source 20 into parallel rays such that a sufficient concentration of actinic radiation is available to form with the imaging system 18 the land surface areas 16 of the imaged surface 14 in the liquid resin layer 15. As such, the condenser 22 receives light from the light source and provides collimated light to the digital light processor 24. Preferably, the condenser 22 comprises a convex lens 28 at a first end and an adjustable slit 30 at the other end, the slit being in the focal plane of the lens. Alternatively, the condenser 22 may be a single mirror. The condenser 22 may also comprise a plurality of lenses, one or more lenses in combination with at least one mirror, a plurality of mirrors, or a combination of one or more mirrors with at least one lens.

The digital light processor 24 selectively modulates the received collimated light into a desired image pattern and directs the desired image pattern to the projection optics 26. The projection optics 26 are conventional and used to focus and position the image output onto the liquid photoresin layer 15 to form the land surface areas 16 of the imaged surface 14. In a typical application the projection optics will provide a 16:9 aspect ratio (width to height), however, other aspect ratios may be used. The projection optics are preferably formed by a so-called Dyson imaging system including a field lens, aperture lens, and spherical imaging mirror. The input and output numerical aperture is 0.167. The magnification is 1 to 1. In the preferred embodiment, the object and the image size is 10.2×13.6 mm.

The digital light processor 24 converts digital content into a digital bit stream that can be read by an included mirror-type spatial light modulator 32. Preferably, the digital content is composed on a microprocessor 34 that is in communication with the digital light processor 24 for image generation by the imaging system 18. However, other sources of the digital content, such as memory chips, analog-to-digital decoders, video processors, digital signal processors, may also be processed by the digital light processor 24.

Generally, the mirror-type spatial light modulator 32 is an individually addressable matrix of modulating micromirrors that build digital images based on the provided digital bit stream. Mirror-type spatial light modulators include devices which tilt each micromirror by electrostatic force, devices which tilt each micromirror by mechanical deformation of a fine piezoelectric element, and the like. One suitable spatial light modulator 32 is the Digital Micromirror Device developed by Texas Instruments. The DMD semiconductor is an optical switch or a reflective spatial light modulator that consists of a matrix of about 1 million digitally-controlled microscopic mirrors. Each digitally controlled microscopic mirror is mounted on a hinge structure to allow each mirror to tilt at an angle from a horizontal plane between two states, +theta degrees for "on" or −theta degrees for "off."

For the DMD semiconductor, the mirror tilt angle is ±10 degrees from the plane of the silicon substrate. As data "1" of the bit stream is written to a memory cell of the light modulator 32, the associated micromirror tilts by +theta degrees which directs a pixel of light from the light source 20 onto the liquid resin layer 15, via the projection optics 26. As data "0" of the bit stream is written to a memory cell of the light modulator, the associated micromirror tilts by −theta degrees which directs the light away from the projection optics 26, and preferably into a light absorber (not shown).

Each microscopic mirror can be electrically switched "on" and "off" up to approximately 50,000 times per second in accordance with the provided digital bit stream. As such, the wavelength or gray scale of incident light from the light source 20 is controlled by the duration of time that a micromirror is in the "on" state. By controlling the wavelength or gray scale of the light source 20, for each pixel, a desired image pattern 40 is formed from the actinic radiation 38 of the light source 20. By this method, the land surface areas 16 of the imaged surface 14 may be formed relatively quickly as practically all of the incident light from the light source 20 is reflected toward the liquid resin layer 15.

Additionally, because the light modulator 32 has a plurality of micromirrors arranged in a matrix, a full frame image of information on resin layer 15 is photo-curable at one time. Furthermore, because each micromirror has a size of about 16 by 16 micrometers and the micromirrors are spaced less than 17 microns from each other, this close spacing of the micromirrors results in images that are projected as seamless, with higher resolution and little apparent pixellation. Moreover, with each micromirror being rectangular shaped, each reflected incident of light creates a rectangular pixel with extremely sharp edges 42 (FIG. 2) in the developed resin layer 13. This is unlike the circular or rounded pixels created by laser imaging.

Accordingly, the land surface areas 16 of the imaged surface 14 are formed by the light processor 24 reflecting actinic radiation in a precise pattern and with the proper amount of intensity from the light source 20, through the projection unit 26, and onto the support base 12, thereby permitting cross-linking of the supported liquid photoresin layer 15 in one step. Furthermore, it is to be appreciated that such an arrangement permits longer exposure times with gray scale modulation than scanning systems which must cross-link the photoresin linearly across a moving surface of the photoresin. Moreover, each light-modulating element of the digital light processor 24 has the advantage of a consistent spot size, shape, and location which permits the formation of sharp images with well-defined boundaries. The currently available DMD semiconductor from Texas Instruments permits imaging resolutions up to 1024 pixels by 768 pixels. However, the full-frame imaging approach of the present invention can also easily be applied to any projection device that may result in higher resolutions and improved print quality.

In order that the invention may be more readily understood, reference is made to the following method steps, which are intended to be illustrative of a preferred use of the imaging system 18 of the invention, but are not intended to be limiting in scope.

In using the imaging system 18 to produce the liquid transfer article 10, preferably, the polymer base layer 12 is formed separately from the imaging system 18 using a large area, pulsed UV curing unit, such as a Xenon Corporation RC-500B. In this manner, the base layer 12 is then provided to the imaging system 18 on a support assembly 36 as a stock material.

Alternatively, the polymer base 12 may be formed by the imaging system 18 directly or by an optional back flash step. The back-flash step is a blanket exposure of a quantity of a liquid resin to actinic radiation through the support assembly 36 to form the base layer 12. Any of the conventional radiation sources discussed above may be used for the back flash step. Exposure times generally range from a few seconds up to about a minute.

Preferably, the polymer base layer 12 is formed using a formulation of 98.5% SL 5149 and 1.5% Irgacure 819 which is cured to a thickness of about 0.1 mm to about 0.4 mm. It should, however, be appreciated by those persons skilled in the art that any other formulation which provides a suitable support base upon which the developed photoresin layer 13 bonds may be used. Additionally, it should be appreciated that the polymer base layer 12 is of an appropriate shape and size for use as a printing plate. Generally, the shape of polymer base layer 12 will be rectangular, as illustrated in FIG. 1.

Next, a quantity of the liquid photoresin 15 is provided to cover either a portion or the entire base layer 12. The liquid photoresin 15 is preferably the same formulation used to form the polymer base layer 12. However, the liquid photo resin 15 may contain other additives depending on the final properties desired for the photoresin layer 13. Such additives include sensitizers, rheology modifiers, thermal polymerization inhibitors, tackifiers, plasticizers, colorants, antioxidants, or fillers.

As shown in FIG. 3, the support assembly 36, carrying both the liquid photoresin layer 15 and the base layer 12 thereon, is positioned relative to the imaging system 18 to accommodate the production of the liquid transfer article 10 of a desired size. The support plate 36 may be movable to automate the positioning of a new plate having a base and a quantity of photoresin thereon under the imaging system 18. However, the support assembly 36 is preferably stationary at least during the exposure of the liquid photoresin layer 15 with actinic radiation.

With the support assembly 36 in proper alignment with the imaging system 18, actinic radiation 38 from light source 18 is then directed through condenser 22 towards the light modulation elements 32 of the light processing device 24. The actinic radiation is then processed into the desired image pattern 40 based on an inputted digital bit stream and reflected by the micromirror device 24 through projection unit 26 and onto selected portions of the liquid photoresin layer 15 for activation and hardening. It is to be appreciated that the desired image pattern 40 projected by the light processing device 24 at one instance is a full-frame image, such as illustrated in FIG. 1. For liquid transfer articles requiring well depths deeper than 1.0 mm, several layers of the developed photoresin 13 can be polymerized sequentially upon each other in this manner.

As generally known in the art, the actinic radiation exposure time can vary from a few seconds to several minutes, depending upon the intensity and spectral energy distribution of the radiation, its distance from the imaging element, and the nature, size, and thickness of the photopolymerizable relief imaging layer. Additionally, the processing temperature will vary depending upon the application, the desired image size, and the photocompositions used in the process.

Once the liquid photoresin layer 15 has been properly hardened by the projected image pattern 40, any excess, undeveloped photoresin is washed away in a developer leaving the crossed-linked land surface areas 16 of the developed photoresin layer 13 upon the base layer 12 and formed around imaged surfaces 14 (FIG. 2). As generally known in the art, the choice of the developer will depend primarily on the chemical nature of the photopolymerizable material to be removed. Typically, development is usually carried out at about room temperature, in which the developers can be organic solvents, aqueous or semi-aqueous solutions, and water.

Suitable organic solvent developers include aromatic or aliphatic hydrocarbon and aliphatic or aromatic halohydrocarbon solvents, or mixtures of such solvents with suitable alcohols. Suitable semi-aqueous developers usually contain water, a water miscible organic solvent, and an alkaline material. Suitable aqueous developers usually contain water and an alkaline material. The developer can be applied in any convenient manner, including immersion, spraying and brush or roller application. Brushing aids can be used to remove the undeveloped portions of the composition. However, washout is frequently carried out in an automatic processing unit which uses a developer and mechanical brushing action to remove the unexposed portions of the plate, leaving a developed resin layer 13 constituting the land surface areas 16 of the imaged surface 14 upon the polymer base layer 12.

Following solvent development, the relief printing plates are generally blotted or wiped dry and then dried in a forced air or infrared oven. Drying times and temperatures may vary, however, typically the plate is dried for 60 to 120 minutes at 60 degrees C. High temperatures are not recommended because the support can shrink and this can cause registration problems.

Detackification is an optional post-development treatment which can be applied if the surface is still tacky, such tackiness not generally being removed in post-exposure. Tackiness can be eliminated by methods well known in the art, such as treatment with bromine or chlorine solutions. Such treatments have been disclosed in, for example, U.S. Pat. No. 4,400,459 to Greetzmacher, and U.S. Pat. No. 4,400,460 to Fickes et al. Detackification can also be accomplished by exposure to radiation sources having a wavelength not longer than 300 nm, as disclosed in U.S. Pat. No. 4,806,506 to Gibson.

Most photoresin printing plates are uniformly post-exposed to ensure that the photopolymerization process is complete and that the plate will remain stable during printing and storage. This post-exposure step may utilize the same radiation source used to expose the polymer base layer 12.

If desired, for increased durability, any suitable ceramic coating, such as a refractory oxide or metallic carbide coating, may be applied to the surface of the developed photoresin layer 13. For example, tungsten carbide-cobalt, tungsten carbide-nickel, tungsten carbide-cobalt chromium, tungsten carbide-nickel chromium, chromium-nickel, aluminum oxide, chromium carbide-nickel chromium, chromium carbide-cobalt chromium, tungsten-titanium carbide-nickel, cobalt alloys, oxide dispersion in cobalt alloys, aluminum-titania, copper-based alloys, chromium based alloys, chromium oxide, chromium oxide plus aluminum oxide, titanium oxide, titanium plus aluminum oxide, iron based alloys, oxide dispersed in iron based alloys, nickel and nickel based alloys, and the like may be used. Preferably chromium oxide, aluminum oxide, silicon oxide or mixtures thereof could be used as the coating material, with chromium oxide being the most preferred.

Figure 4:
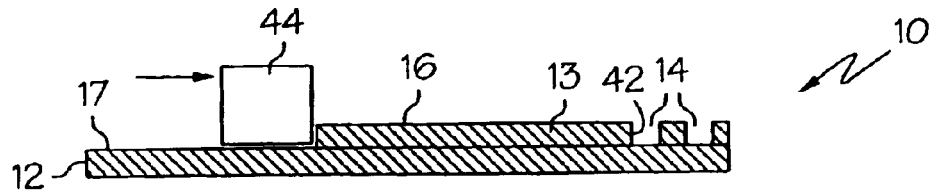
FIG. 4 is a schematic diagram of the liquid transfer article of FIG. 1 taken along section line 2—2 as the image is being removed by an abrading mechanism.

Because the process of the present invention forms the land surface areas 16 bounding the imaged surface 14 directly onto the surface 17 of the polymer base 12 with no intervening mask, there is no distortion of the image, which remains sharp and well defined. In addition, the photoresin layer 13 may be removed from the surface 17 of the polymeric base layer 12 and new images built up on the surface. For example, as schematically illustrated in FIG. 4, showing the photoresin layer 13 partially removed, the land surface areas 16 may be removed by a suitable polymer abrading mechanism 44 which mechanically grinds, scrapes, or cuts away the image until the surface 17 of the base layer 12 remains. The reprocessed base layer 12 may then be provided upon which a new imaged surface may be formed as previously described.

Because the images for each printing job may be stored in computer memory, the printer need not stock in inventory multiple liquid transfer articles. Rather, each printing job may be created and the same polymer support base imaged repeatedly, reducing both storage and materials cost. Further, because each print job is digitally imaged directly on the base layer 12, the print quality is high. Moreover, this technique enables liquid transfer articles of variable widths to be rapidly produced.

Figure 5:
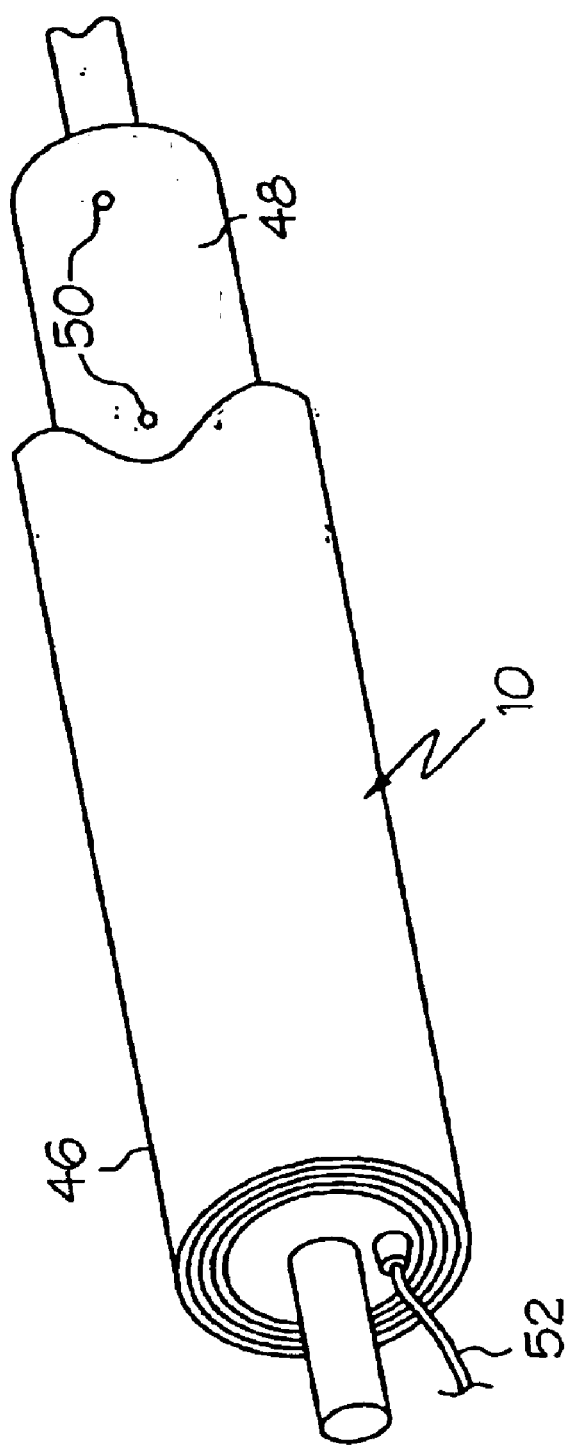
FIG. 5 is an elevated view, partially cut-away, of a second illustrative embodiment of a liquid transfer article with an image surface formed according to the methods of the present invention, which may be used with a printing device as a printing plate.

With regard to other printing arrangements, FIG. 5 illustrates a preferred, exemplary embodiment of the present invention in which the liquid transfer article 10 formed by the above described methods, is then provided in the form a replaceable sleeve 46 mounted on a conventional printing cylinder 48. However, it will be apparent to those skilled in the art that the liquid transfer article 10 may be adapted to be mounted on a variety of other carriers, such as for example, the flat plate embodiment of FIG. 1. In one method, the cylinder 48 is hollow and may include an interior chamber (not shown) which is used as a compressed air chamber through which air may be passed for expanding the sleeve 46 during mounting and dismounting operations. The cylinder 48 may include a plurality of spaced apart, radially-extending apertures 50 from which air in the chamber may exit to or which may be used to expand the sleeve 46 during mounting and dismounting operations. The air is introduced into the chamber by an air hose 52 which can communicate with the apertures of the cylinder 48. The sleeve 46 is typically mounted onto the cylinder 48 by introducing air at a pressure of about 80–120 psi (5.6 to 8.4 $kg/cm^2$) to expand the sleeve and permit it to be slipped onto the cylinder.

While certain representative embodiments and details have been shown for purposes of illustrating the invention, it will be apparent to those persons skilled in the art that various changes in the methods and apparatus disclosed herein may be made without departing from the scope of the invention.

What is claimed is:

1. A digital imaging photopolymerization system for providing a cross-linked photopolymerized liquid transfer article for use in graphic arts reproduction, said system comprising:

a support assembly adapted to receive at least a first layer of a cross-linkable liquid photopolymer;

a light source for irradiating said cross-linkable liquid photopolymer layer, said light source and said support assembly are adapted to be held stationary at least during the formation of the cross-linked photopolymerized liquid transfer article;

a mirror-type spatial light modulator disposed between said light source and said support assembly, said modulator reflects light from said light source in full frame image pattern toward said support assembly; and a microprocessor connected to at least said mirror-type spatial light modulator for controlling its operation such that a cross-linked full frame imaged surface corresponding to the full image pattern is formed in the cross-linkable liquid photopolymer layer in one step and without a mask while said light source and support assembly are stationary, said imaged surface being suitable for graphic arts reproduction applications.

2. The digital imaging system of claim 1 in which said light source comprises a visible light source.

3. The digital imaging system of claim 1 in which said mirror-type spatial light modulator has a matrix of individually addressable micromirrors.

4. The digital imaging system of claim 1 wherein said support assembly is a generally flat surface.

5. The digital imaging system of claim 1 wherein said support assembly is a sleeve.

6. A digital imaging photopolymerization system for providing a cross-linked photopolymerized liquid transfer article for use in graphic arts reproduction, said system comprising:

a support assembly having a substantially flat surface adapted to receive at least a first layer of a cross-linkable liquid photopolymer;

a light source for irradiating said cross-linkable liquid photopolymer layer, said light source and said support assembly are adapted to be held stationary at least during the formation of the cross-linked photopolymerized liquid transfer article;

a spatial light modulator disposed between said light source and said support assembly, said modulator provides light from said light source in a full frame image pattern toward said support assembly; and a microprocessor connected to said spatial light modulator for controlling operation of said modulator such that a cross-linked full frame imaged surface corresponding to the full image pattern is formed in the cross-linkable liquid photopolymer layer in one step and without a mask while said light source and support assembly are stationary, said imaged surface being suitable for graphic arts reproduction applications.

7. The digital imaging system of claim 6 in which said light source provides radiation having a wavelength in a range from about 300 nm to about 500 nm.

8. The digital imaging system of claim 6 in which said spatial light modulator has a matrix of individually addressable micromirrors controlled by said microprocessor.

9. The digital imaging system of claim 6 in which said graphic arts reproduction applications includes gravure applications, and anilox applications.

10. The digital imaging system of claim 6 wherein said imaged surface may take the form of any indicia including numbers, letters, and graphics.

11. The digital imaging system of claim 6 wherein said cross-linkable liquid photopolymer is selected from the group consisting of acrylates, epoxies, urethanes, unsaturated polyesters, and combinations thereof.

* * * * *